United States Patent
Iucolano et al.

(10) Patent No.: US 12,218,231 B2
(45) Date of Patent: Feb. 4, 2025

(54) HEMT TRANSISTOR INCLUDING FIELD PLATE REGIONS AND MANUFACTURING PROCESS THEREOF

(71) Applicant: STMicroelectronics S.r.l., Agrate Brianza (IT)

(72) Inventors: Ferdinando Iucolano, Gravina di Catania (IT); Alessandro Chini, Modena (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 879 days.

(21) Appl. No.: 17/116,465

(22) Filed: Dec. 9, 2020

(65) Prior Publication Data
US 2021/0175350 A1    Jun. 10, 2021

(30) Foreign Application Priority Data
Dec. 10, 2019   (IT) .................. 102019000023475

(51) Int. Cl.
*H01L 29/778*   (2006.01)
*H01L 29/20*    (2006.01)
*H01L 29/205*   (2006.01)
*H01L 29/40*    (2006.01)
*H01L 29/66*    (2006.01)

(52) U.S. Cl.
CPC ...... *H01L 29/7786* (2013.01); *H01L 29/2003* (2013.01); *H01L 29/205* (2013.01); *H01L 29/404* (2013.01); *H01L 29/66462* (2013.01); *H01L 29/7787* (2013.01)

(58) Field of Classification Search
None
See application file for complete search history.

(56) References Cited

U.S. PATENT DOCUMENTS

| | | | |
|---|---|---|---|
| 2009/0230430 A1* | 9/2009 | Miyamoto | ............ H01L 29/802 257/192 |
| 2012/0018735 A1* | 1/2012 | Ishii | .................. H01L 29/66431 257/E29.242 |

(Continued)

FOREIGN PATENT DOCUMENTS

EP    1901342 A1    3/2008

OTHER PUBLICATIONS

Liu, Z. "AlGaN/AlN/GaN High-Electron-Mobility Transistors Fabricated with Au-Free Technology" App. Phys. Exp. 6 published Aug. 20, 2013 pp. 096502-1 through 096502-4 (Year: 2013).*

*Primary Examiner* — Grant S Withers
(74) *Attorney, Agent, or Firm* — Seed IP Law Group LLP

(57) ABSTRACT

An HEMT transistor includes a semiconductor body having a semiconductive heterostructure. A gate region, of conductive material, is arranged above and in contact with the semiconductor body. A first insulating layer extends over the semiconductor body, laterally to the conductive gate region. A second insulating layer extends over the first insulating layer and the gate region. A first field plate region, of conductive material, extends between the first and the second insulating layers, laterally spaced from the conductive gate region along a first direction. A second field plate region, of conductive material, extends over the second insulating layer, and the second field plate region overlies and is vertically aligned with the first field plate region.

19 Claims, 10 Drawing Sheets

(56) References Cited

U.S. PATENT DOCUMENTS

| | | |
|---|---|---|
| 2014/0092638 A1* | 4/2014 | Nishimori ......... H01L 29/66431 |
| | | 257/194 |
| 2017/0294530 A1 | 10/2017 | Moens et al. |
| 2019/0035910 A1* | 1/2019 | Moens .................. H01L 21/266 |
| 2020/0051823 A1 | 2/2020 | Iucolano et al. |
| 2020/0168718 A1 | 5/2020 | Iucolano et al. |
| 2020/0194579 A1 | 6/2020 | Iucolano et al. |

* cited by examiner

HEMT TRANSISTOR INCLUDING FIELD PLATE REGIONS AND MANUFACTURING PROCESS THEREOF

BACKGROUND

Technical Field

The present disclosure relates to a High Electron Mobility Transistor (HEMT) including field plate regions and the manufacturing process thereof.

Description of the Related Art

As known, the HEMT transistors, also known as heterostructure field effect transistors (HFET), are finding wide diffusion, because of the possibility of operating at high voltages, as well as at high breakdown voltages.

In each HEMT transistor, a semiconductive heterostructure allows a so-called 2-dimensional electron gas (2 deg), forming a channel region of the HEMT transistor, to be generated in an electronically controllable manner. Furthermore, each HEMT transistor comprises a gate region; the HEMT transistor channel is modulated by the voltage on the gate region.

For example, FIG. 1 shows a HEMT transistor 1, comprising a semiconductor body 2, here formed by a first and a second layers 4, 6, hereinafter also referred to as lower layer 4 and upper layer 6.

The lower layer 4 is formed by a first semiconductor material, such as for example a first semiconductive alloy of elements of the groups III and V of the periodic table; for example, the lower layer 4 may be formed by gallium nitride (GaN).

The upper layer 6 overlies, and is in direct contact with, the lower layer 4, and is formed by a second semiconductor material, such as for example a second semiconductive alloy, different from the first semiconductive alloy, of elements of the groups III-V of the periodic table. For example, the upper layer 6 may be formed by aluminum gallium nitride (AlGaN). The lower layer 4 and the upper layer 6 are for example of N-type. Although not shown, the semiconductor body 2 further comprises a substrate, typically formed by silicon, on which the lower layer 4 is formed.

The HEMT transistor 1 further comprises a source metallization 20 and a drain metallization 22 arranged, at a mutual distance, above the upper layer 6. The source metallization 20 and the drain metallization 22 may be in direct ohmic contact with respective source and drain regions, as taught, e.g., in US 2020/0168718 (corresponding to EP 3 660 923A1). In particular, the source 20 and drain metallizations 22 have a respective lower portion 20A, 22A, directly overlying and contiguous to the upper layer 6, and a respective upper portion 20B, 22B, contiguous and in prosecution with the respective lower portion 20A, 22A. The source 20 and drain metallizations 22 are for example of titanium and aluminum or multi-layer stacks.

A first insulating layer 8, for example of silicon nitride, extends above the upper layer 6 and part of the lower portions 20A, 22A of the source 20 and drain metallizations 22. Furthermore, the first insulating layer 8 has an opening 11 arranged at an intermediate position between the lower portions 20A, 20B of the source 20 and drain metallizations 22.

A gate region 10, of conductive material, extends partly within the opening 11 (with a lower gate portion 10A) and partly above the first insulating layer 8 (with an upper gate portion 10B). The gate region 10 is formed, for example, by a stack of materials, such as nickel (Ni), gold (Au), platinum (Pt) and palladium (Pd), with the nickel layer directly in contact with upper layer 6 and forming therewith a metal-semiconductor junction of the Schottky type, that is rectifying.

A second insulating layer 12, for example of silicon nitride, extends above the first insulating layer 8 and surrounds the upper gate portion 10A. In practice, the second insulating layer 12 and the first insulating layer 8 form an insulating structure 13 sealing the gate region 10.

A field plate region 14 extends above the second insulating layer 12, partly vertically overlying the gate region 10 and partly laterally offset, towards the drain metallization region 22. The field plate region 14, for example of aluminum, has the aim of modifying the existing electric field during operation of the HEMT transistor 1. The field plate region 14 is electrically coupled to the source metallization 20, in a not shown manner.

A passivation layer 16, for example of silicon oxide, surrounds the upper portions 20B, 22B of the source 20 and drain metallizations 22 and the field plate region 14 and covers the whole structure.

Another embodiment of a HEMT transistor is described in US 2020/0194579 (corresponding to Italian patent application 102018000011065 filed on 13 Dec. 2018 in the name of the Applicant) and allows the drain leakage current to be reduced. This solution is shown in FIG. 2, slightly modified with respect to what shown in the aforementioned patent application, to highlight the differences with respect to the HEMT transistor 1.

FIG. 2 shows a HEMT transistor 30 having a general structure similar to the one of the HEMT transistor 1 of FIG. 1; therefore like parts are identified with the same reference numbers and will no longer be described.

In the HEMT transistor 30 of FIG. 2, the insulation structure 13 comprises, in addition to the first and second insulating layers 8, 12, a dielectric layer 32 extending between them and, partly, within the gate region 10. The dielectric layer 32 may also be of silicon nitride. In this way, the gate region 10, besides having a lower gate portion 10A and an upper gate portion 10B, has a first and a second intermediate gate portion 10C and 10D, arranged between the lower gate portion 10A and the upper gate portion 10B.

In detail, the first intermediate gate portion 10C is contiguous to the lower gate portion 10A, extends above the first insulating layer 8 and has an area (in a cross-section perpendicular to the drawing plane) approximately equal to that of the upper gate portion 10B. The second intermediate gate portion 10D is arranged between the first intermediate gate portion 10C and the upper gate portion 10B, in physical continuity with them, and has an area (in a cross-section perpendicular to the drawing plane) smaller than the area of the first intermediate gate portion 10C and the upper gate portion 10B. The second intermediate gate portion 10D has a thickness approximately equal to that of the dielectric layer 32.

In practice, the dielectric layer 32 extends partly laterally to the first intermediate gate portion 10C and partly (with a substantially annular portion thereof) between the first and the second intermediate gate portions 10C, 10D and has an opening (called second opening 33) accommodating the second intermediate portion 10D.

This allows the gate region 10 to be made by three different alloys (not shown); specifically, the lower gate portion 10A and the first intermediate portion 10C may be of a first metal (for example, nickel Ni) forming a Schottky contact with the body 2; the upper gate portion 10B may be of a second metal (for example, aluminum Al) having low resistance; and the second intermediate portion 10D may be of a third material (for example, tungsten nitride WN or tantalum nitride TaN or TiN), which serves as a barrier layer and prevents the aluminum of the upper gate portion 10B from diffusing, through the first intermediate portion 10C and the lower gate portion 10A, down to the upper layer 6 of the body 2, which would lead to damaging the Schottky junction.

The structures shown in FIGS. 1 and 2 have a very good behavior in frequency, from frequencies lower than 6 GHz up to frequencies in the range 30-50 GHz (millimeter-waves), and very good switching capacities, but are susceptible of improvement as regards the gain and electric field uniformity when high voltages are applied to the gate region.

BRIEF SUMMARY

In various embodiments, the present disclosure provides an improved HEMT transistor and a manufacturing process thereof.

In at least one embodiment of the present disclosure, a HEMT transistor is provided that includes a semiconductor body having a semiconductive heterostructure. A gate region, of conductive material, is arranged on and in contact with the semiconductor body. A first insulating layer extends over the semiconductor body, laterally to the conductive gate region. A second insulating layer extends over the first insulating layer and the gate region. A first field plate region, of conductive material, extends between the first and the second insulating layers, laterally spaced from the conductive gate region along a first direction. A second field plate region, of conductive material, extends over the second insulating layer, and the second field plate region overlies the first field plate region.

In at least one embodiment, a process is provided that includes: forming a semiconductive heterostructure in a semiconductor body; forming, on the semiconductor body, a first insulating layer having a first opening; forming a gate region, of conductive material, on and in contact with the semiconductor body, the gate region extending into the opening; forming a first field plate region, of conductive material, on the first insulating layer, the first field plate region spaced laterally apart from the conductive gate region; forming a second insulating layer over the gate region, the first field plate region and the first dielectric layer; and forming a second field plate region, of conductive material, over the second insulating layer, the second field plate region overlying and vertically aligned with the first field plate region.

In at least one embodiment, a device is provided that includes a semiconductor body having a semiconductive heterostructure. A conductive gate region is disposed on the semiconductor body. A first insulating layer is disposed on the semiconductor body, and at least a portion of the conductive gate region extends through an opening in the first insulating layer. A second insulating layer is disposed on the first insulating layer and the conductive gate region. A first conductive field plate extends between and in contact with the first and the second insulating layers, and the first conductive field plate is spaced laterally apart from the conductive gate region along a first direction. A second conductive field plate is disposed on the second insulating layer, and the second conductive field plate overlies the first conductive field plate along a second direction transverse to the first direction. The second insulating layer extends directly between the first conductive field plate and the second conductive field plate along the second direction.

BRIEF DESCRIPTION OF THE SEVERAL VIEWS OF THE DRAWINGS

For a better understanding of the present disclosure, some embodiments thereof are now described, purely by way of non-limiting example, with reference to the attached drawings, wherein.

DETAILED DESCRIPTION

Figure 3:
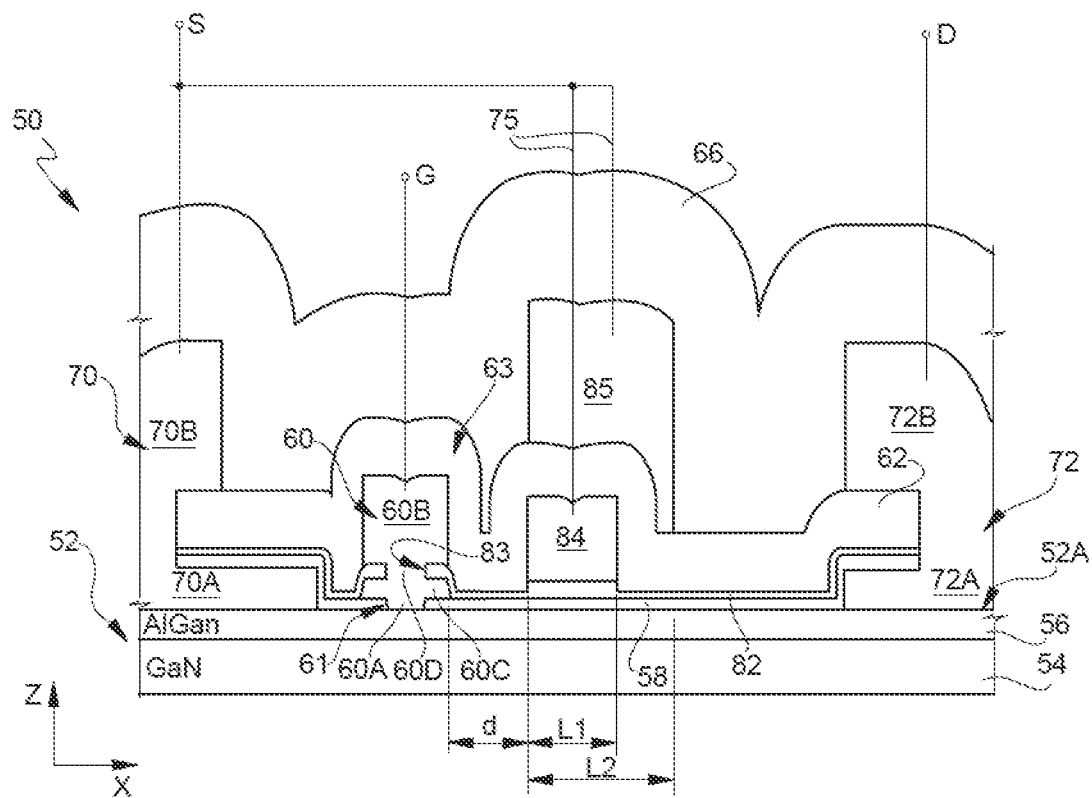
FIG. 3 schematically shows a cross-section of an embodiment of the present HEMT transistor.

FIG. 3 shows a HEMT transistor 50 according to an embodiment.

The HEMT transistor 50 has a general structure similar to the HEMT transistor 30 of FIG. 2, thus briefly described herein below; the regions thereof have been identified by numbers incremented by 50.

The HEMT transistor 50 comprises a semiconductor body 52, here formed by a lower layer 54, for example, of gallium nitride (GaN), and an upper layer 56, for example, of aluminum gallium nitride (AlGaN). The upper layer 56 forms a surface 52A of the semiconductor body 52. In a not shown manner, the semiconductor body 52 may further comprise a silicon substrate and/or the upper layer 56 may be a multilayer, including layers of AlGaN with different percentage of aluminum (for example one AlGaN layer with 20% of aluminum and another AlGaN layer with 40%).

A source metallization 70 and a drain metallization 72 extend, at a mutual distance, above the body 52. Also here, the source 70 and drain metallizations 72 comprise lower portions 70A, 72A and upper portions 70B, 72B, and are, for example, of aluminum. The source 70 and drain metallizations 72 form source and drain electrodes and are electrically coupled to respective source and drain terminals S, D.

A first insulating layer 58, for example of silicon nitride, extends above the upper layer 56 and part of the lower portions 70A, 72A of the source 70 and drain metallizations 72.

A gate region 60, of conductive material, extends above the semiconductor body 52 and comprises a lower gate portion 60A (extending into an opening, called first opening 61, of the first insulating layer 58, and in direct contact with the upper layer 56 of the semiconductor body 52), an upper gate portion 60B, a first intermediate gate portion 60C and a second intermediate gate portion 60D, arranged between the lower gate portion 60A and the upper gate portion 60B. Here again, the gate region 60 may be formed by a stack of materials, for example nickel (Ni), aluminum Al and tungsten nitride (WN) or tantalum nitride (TaN).

The gate region 60 is electrically coupled to a gate terminal G.

A dielectric layer 82, for example of silicon nitride, extends above the first insulating layer 58 and, partly, within the gate region 60. Therefore the dielectric layer 82 has an opening (also called second opening 83) wherein the second intermediate portion 60D of the gate region 60 extends.

A second insulating layer 62, for example of silicon nitride, extends above the dielectric layer 82 and surrounds the upper gate portion 60A on the top and laterally. In practice, the second insulating layer 62 forms, with the first insulating layer 58 and the dielectric layer 82, an insulation structure 63 sealing the gate region 60.

A passivation layer 66, for example of silicon oxide, surrounds the upper portions 70B, 72B of the source and drain metallizations 70, 72 and covers the whole structure.

The transistor 50 of FIG. 3 has a first and a second field plate region 84, 85, of conductive material such as a metal, for example of aluminum.

The first field plate region 84 extends above the dielectric layer 82, between the gate region 60 and the drain metallization 72, and is covered by the second insulating layer 62. In the embodiment shown, the first field plate region 84 is arranged closer to the gate region 60 than to the drain metallization 72. For example, in the direction in which the source metallization 70, the gate region 60, the first field plate region 84 and the drain metallization 72 are adjacent (direction parallel to a first Cartesian axis X in FIG. 3), the first field plate region 84 may have a width L1 depending on the breakdown voltage, for example comprised between 0.1 and 3 µm, for example of 1 µm, and may be arranged at a distance d of 0.1 to 3 µm, for example of 1 µm from the gate region 60 (the distance d being calculated, approximately, from the edge of the upper gate portion 60B facing the first field plate region 84).

The first field plate region 84 may be of a same conductive material, in particular of the same metal layer, and manufactured in the same manufacturing step as the upper gate portion 60B, as discussed in detail below with reference to FIGS. 6A-6D.

The second field plate region 85 extends above the second insulating layer 62, vertically overlying (with respect to a second Cartesian axis Z) the first field plate region 84, and is covered by the passivation layer 66. The second field plate region 85 has a width L2 at least equal to, but generally greater than, the width L1 of the first field plate region 84. For example, the width L2 of the second field plate region 85 may be comprised between 0.1 and 5 µm.

The field plate regions 84, 85 are electrically coupled to the source metallization 70, as shown by lines 75. In particular, the second field plate region 85 may be formed together with and using the same metal layer as the upper portions 70B and 72B of the source and drain regions 70, 72.

The field plate regions 84, 85 have the effect of modifying the existing electric field and in particular making it more uniform during the operation of the HEMT transistor 50. Furthermore, the presence of the first field plate region 84 allows the gain of the HEMT transistor 50 to be considerably increased. In fact, in case of an increase in the drain voltage, the first field plate region 84, acting as a shield between the gate region 60 and the drain metallization 72, has the effect of decreasing the gate-drain capacity to which the gain is inversely related, as discussed below with reference to FIG. 8.

Figure 4:
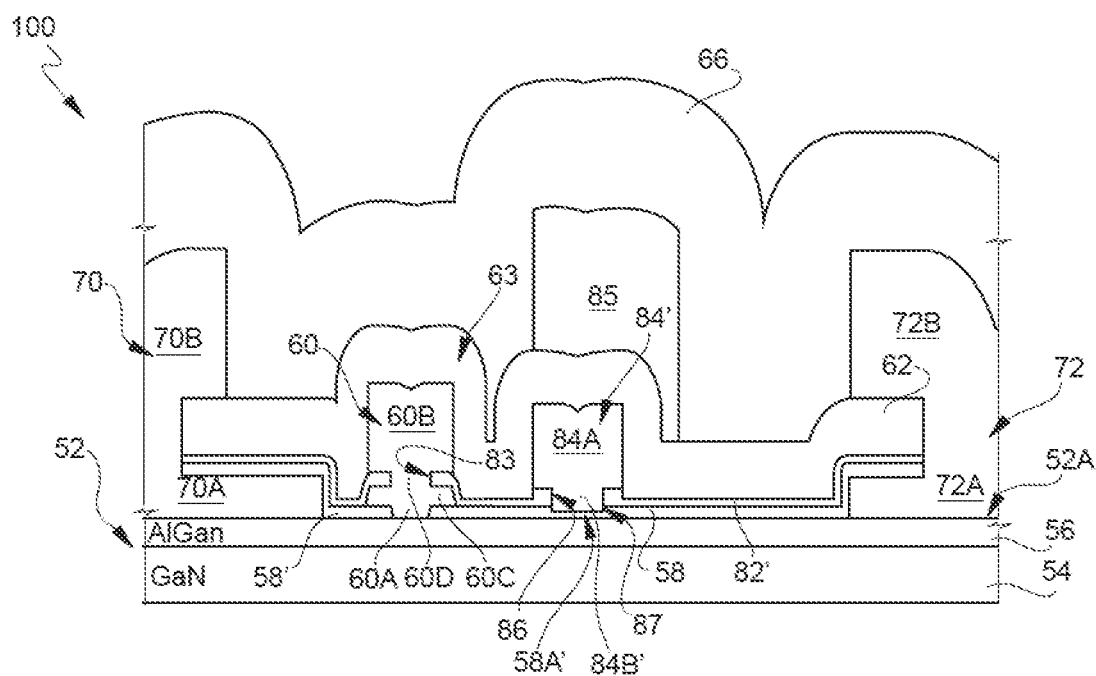
FIG. 4 schematically shows a cross-section of a different embodiment of the present HEMT transistor.

FIG. 4 shows a different embodiment of a HEMT transistor, here indicated with 100.

The HEMT transistor 100 has a general structure similar to the HEMT transistor 50 of FIG. 3. The common parts have thus been provided with the same reference numbers and will not be further described.

In the HEMT transistor 100, the first field plate region, here indicated with 84', comprises a lower plate portion 84A' and an upper plate portion 84B'.

The upper plate portion 84B' of the first field plate region 84' roughly corresponds to the first field plate region 84 of FIG. 3, and thus extends above the second insulating layer 62, laterally to the gate region 60, between the same and the drain metallization 72. The lower plate portion 84A' of the first field plate region 84' extends continuously from the upper plate portion 84B' towards the surface 52A of the semiconductor body 52 through an opening (called third opening 86) of the dielectric layer, here indicated with 82', and, partially, through the first insulating layer, here indicated with 58', in a cavity 87 thereof. The lower plate portion 84A', however, does not completely extend through the first insulating layer 58' and a thinner portion thereof, below referred to as thinned portion 58A', extends between the surface 52A of the semiconductor body 52 and the first field plate region 84', electrically separating the latter from the semiconductor body 52.

This embodiment is characterized by a marked increase in gain and a particularly uniform electric field, as discussed below with reference to FIG. 8.

Figure 5:
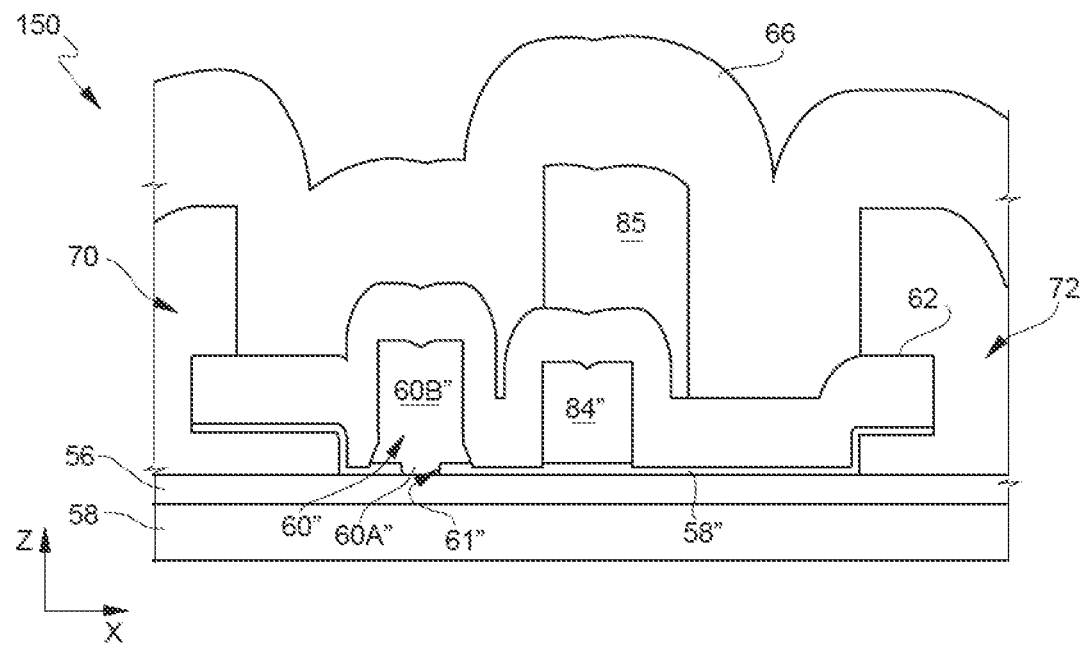
FIG. 5 schematically shows a cross-section of another embodiment of the present HEMT transistor.

FIG. 5 shows another embodiment of a HEMT transistor, here indicated with 150.

Figure 1:
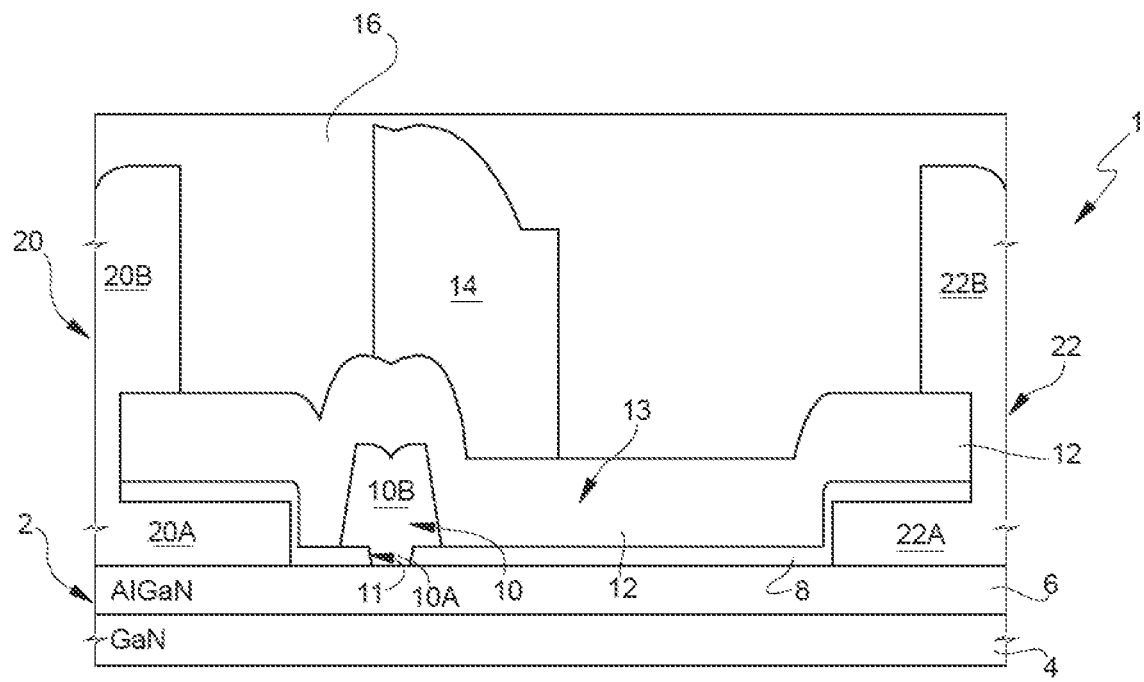
FIG. 1 schematically shows a cross-section of a known HEMT transistor.

The HEMT transistor 150 has a general structure similar to the HEMT transistor 50 of FIG. 3, except for the shape of the gate region (similar to the HEMT transistor 1 of FIG. 1). The parts in common with the HEMT transistor 50 of FIG. 3 have thus been provided with the same reference numbers and will not be further described.

In detail, the HEMT transistor 150 comprises a gate region 60" having a lower gate portion 60A" and an upper gate portion 60B". Furthermore, the HEMT transistor 150 comprises a first insulating layer, indicated with 58" and having an opening 61" accommodating the lower gate portion 60A", and a first field plate region 84". The first field plate region 84" extends above the insulating layer 58" and is coated, laterally and on the top, by the second insulating layer 62.

In this embodiment, the lower gate portion 60A" and the upper gate portion 60B" may be formed by a single deposited (for example "sputtered") metal layer or a single evaporated layer or by a stack of layers deposited separately. In the latter case, the first field plate region 84" may be formed with one of the layers of the gate region 60".

Here again, the second field plate region 85 extends vertically (in direction of the second Cartesian axis Z) above the first field plate region 84".

This embodiment allows a simplification of the manufacturing process, due to the simple shape of the gate region 60".

The manufacturing process of the HEMT transistors 50 and 100 of FIGS. 3 and 4 will now be described, with reference to FIGS. 6A-6D and, respectively, 7A-7D. FIG.

6A shows a cross-section similar to FIG. 3 in an intermediate manufacturing step of the HEMT transistor 50.

Figure 6A:
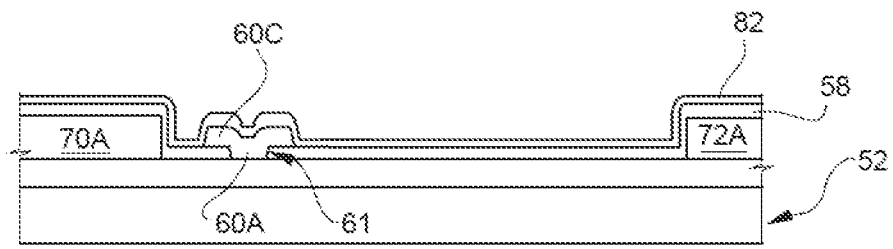
FIGS. 6A-6D show cross-sections similar to that of FIG. 3, in subsequent manufacturing steps.

In particular, FIG. 6A shows an intermediate structure, wherein, above the semiconductor body 52, the lower portion 70A of the source metallization 70, the lower portion 72A of the drain metallization 72, and the first insulating layer 58 have already been formed in a per se known manner; furthermore, the first insulating layer 58 has been etched to form the first opening 61; the lower gate portion 60A in the first opening 61 and the first intermediate gate portion 60C above the lower gate portion 60A have been formed (for example, the lower gate portion 60A and the first intermediate gate portion 60C may be formed simultaneously, by physical vapor deposition (PVD) of a nickel layer within a cavity formed in a temporary structure and having a small-sized opening, related to the area of the first intermediate gate portion 60C) and, after removing the temporary structure, the dielectric layer 82 has been deposited, for example by PECVD deposition.

Figure 6B:
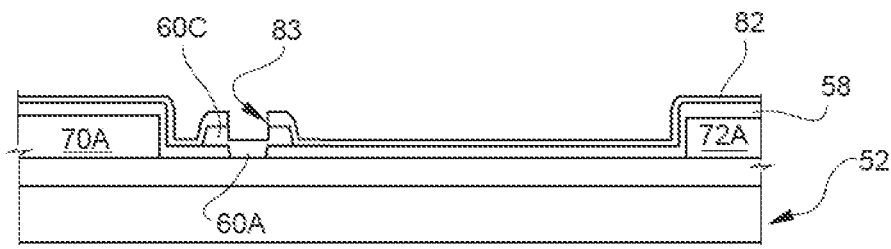

Next, FIG. 6B, a portion of the dielectric layer 82 is removed, for example by dry etching, above the first intermediate gate portion 60C, forming the second opening 83.

Figure 6C:
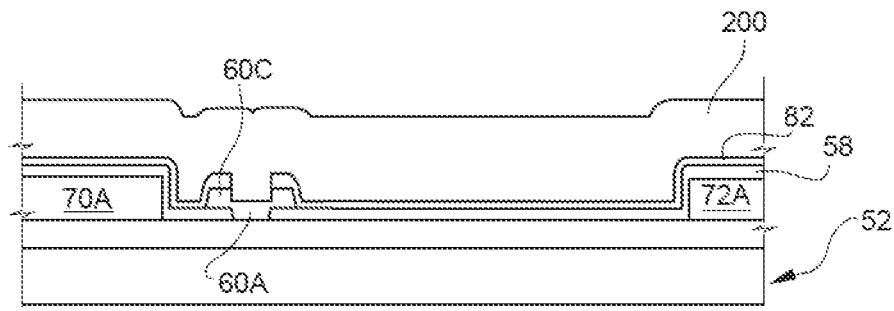

Then, FIG. 6C, two sputtering processes are carried out in succession; in particular a first sputtering process, of tungsten nitride (WN) or tantalum nitride (TaN), forms a first metal layer, which is thinner, fills the second opening 83 and is intended to subsequently form the second intermediate gate portion 60D, and a second sputtering process, for example of aluminum, forms a second metal layer which is thicker. The layer formed of the first and second metal layers is indicated with 200 in FIG. 6C. Alternatively, a sequence of sputtered metal layers, including tungsten nitride/aluminium/titanium nitride WN/Al/TiN may be used.

Figure 6D:
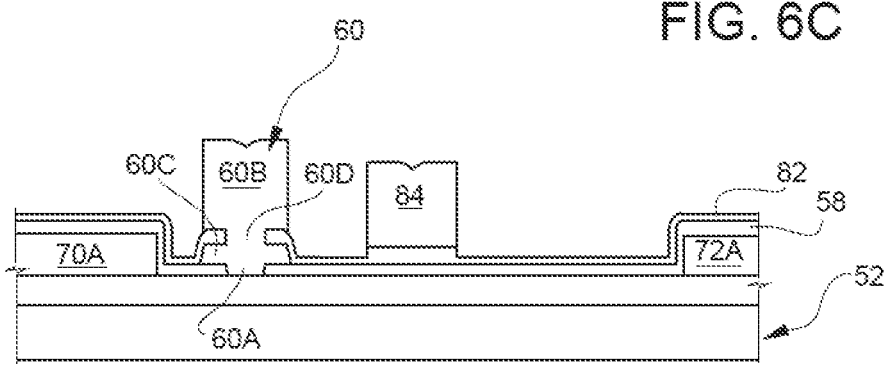

Next, FIG. 6D, for example using a resist mask not shown, portions of the metal layer 200 (also called gate metal layer) are selectively removed, forming the second intermediate gate portion 60D and the upper portion 60B of the gate region 60, as well as the first field plate region 84.

Known steps follow, including deposition of the second insulating layer 62, deposition of a third metal layer, for example aluminum based (such as an Al, AlSiCu or AlCu bi-layer and a Ti, TiN metal layer) by sputtering and subsequent selective removal to form the upper portions 70B and 72B of the source and drain metallizations 70, 72 and the second field plate region 85. Finally the deposition of the passivation layer 66 follows.

Figure 2:
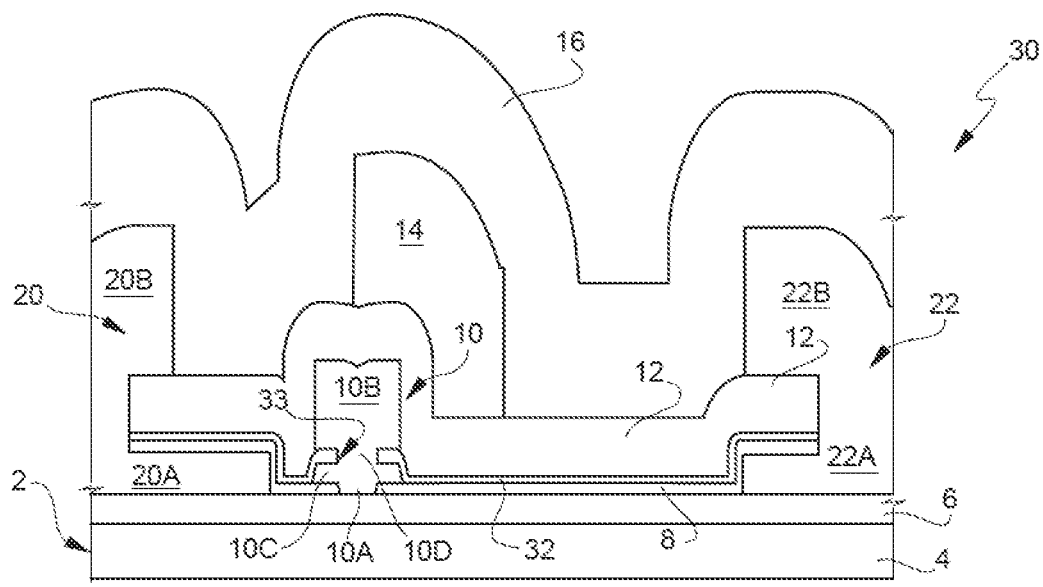
FIG. 2 schematically shows a cross-section of another HEMT transistor.

In this way, the first field plate region 84 may be formed without adding process steps with respect to the manufacturing process of the HEMT transistor 30 of FIG. 2, only through an etching mask modification of the gate metal layer 200, and thus without additional costs.

Figure 7A:
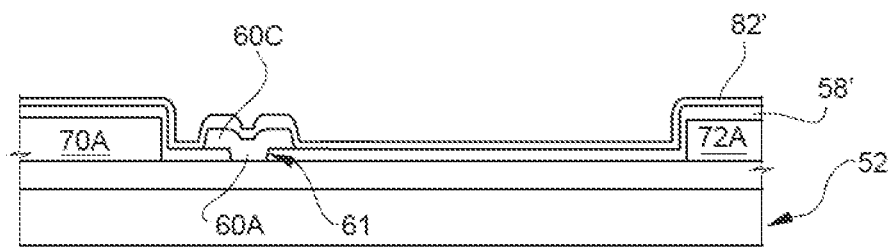
FIGS. 7A-7D show cross-sections similar to FIG. 4, in subsequent manufacturing steps.

FIG. 7A shows a cross-section similar to FIG. 4 in an intermediate manufacturing step of the HEMT transistor 100.

In particular, FIG. 7A shows an intermediate structure wherein, above the semiconductor body 52, the lower portion 70A of the source metallization 70, the lower portion 72A of the drain metallization 72 and the first insulating layer 58' have already been formed, in a per se known manner; furthermore, the first insulating layer 58' has already been etched to form the first opening 61, the lower gate portion 60A in the first opening 61 and the first intermediate gate portion 60C above the lower gate portion 60A have already been formed (for example, the lower gate portion 60A and the first intermediate gate portion 60C may be formed as described above for the HEMT transistor 50) and the dielectric layer 82' has been deposited, for example by PECVD deposition. The intermediate structure of FIG. 7A is thus identical to that of FIG. 6A.

Figure 7B:
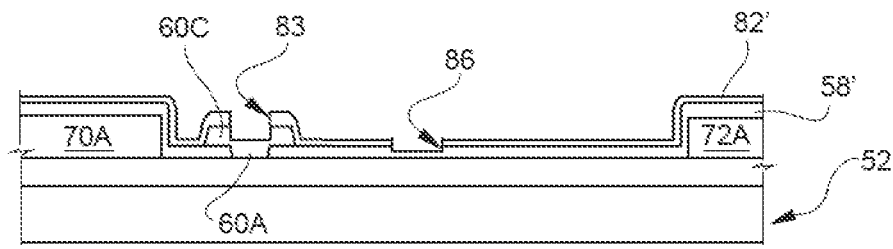

Next, FIG. 7B, a portion of the dielectric layer 82' is removed above the first intermediate gate portion 60C, forming the second opening 83. Furthermore, a portion of the dielectric layer 82' and the underlying portion of the first insulating layer 58' are selectively removed, laterally to the second opening 83, where it is desired to form the first field plate region 84', forming the third opening 86.

Then, FIG. 7C, a gate metal layer 200' is deposited, for example in the manner described above with reference to FIG. 6C, carrying out in succession a first sputtering process, of tungsten nitride (WN) or tantalum nitride (TaN), to form a first metal layer (which is thinner and intended to subsequently form the second intermediate gate portion 60D and the lower portion 84A of the first field plate region 84) and a second sputtering process, for example of aluminum, to form a second metal layer, which is thicker.

Figure 7C:
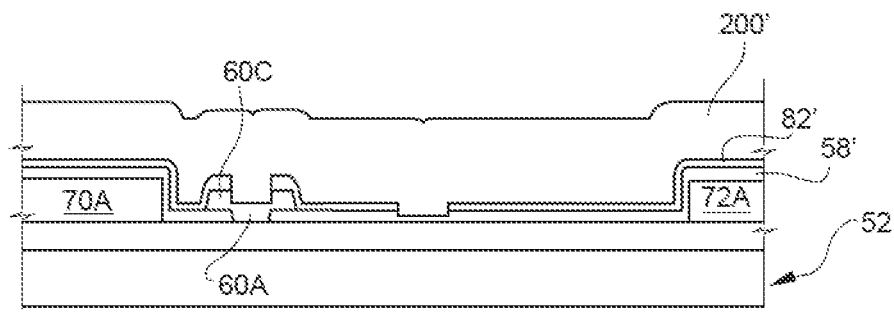
Figure 7D:
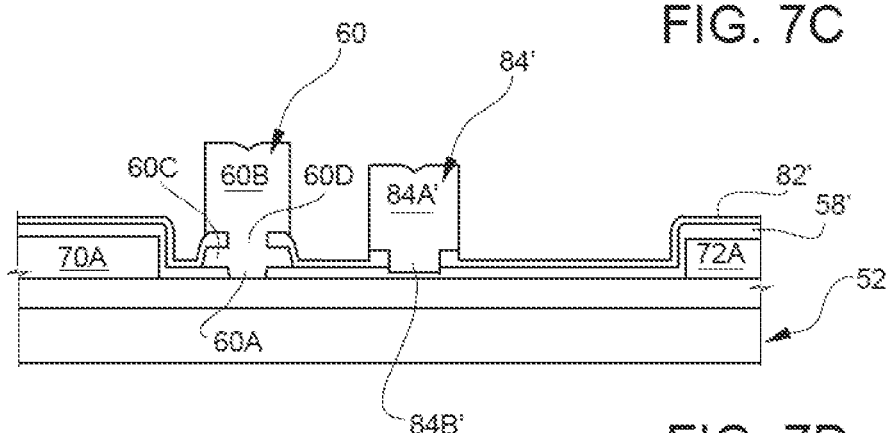

Next, FIG. 7D, for example using a resist mask not shown, portions of the gate metal layer 200' are selectively removed, completing the gate region 60' and the first field plate region 84'.

Known steps follow, including deposition of the second insulating layer 62, deposition of a third metal layer, for example aluminium-based (as indicated above) by sputtering and subsequent selective removal to form the upper portions 70B and 72B of the source and drain metallizations 70, 72 and the second field plate region 85. Finally, the deposition of the passivation layer 66 follows.

Also in this case, the first field plate region 84 may be formed without adding process steps with respect to the manufacturing process of the HEMT transistor 30 of FIG. 2, through an etching mask modification of the gate metal layer 200', and thus without additional costs.

Similarly, the manufacturing process of the HEMT transistor 150 does not require additional steps with respect to those foreseen for forming the HEMT transistor 1 of FIG. 1, and in some embodiments, only some modifications of the mask may be used to define the gate region 60" in order to form the first field plate region 84". The HEMT device shown in FIGS. 3-5 has many advantages. As indicated, due to the presence of an additional shielding region (first field plate region 84, 84', 84"), the HEMT device described has a high gain, as shown in FIG. 8.

Figure 8:
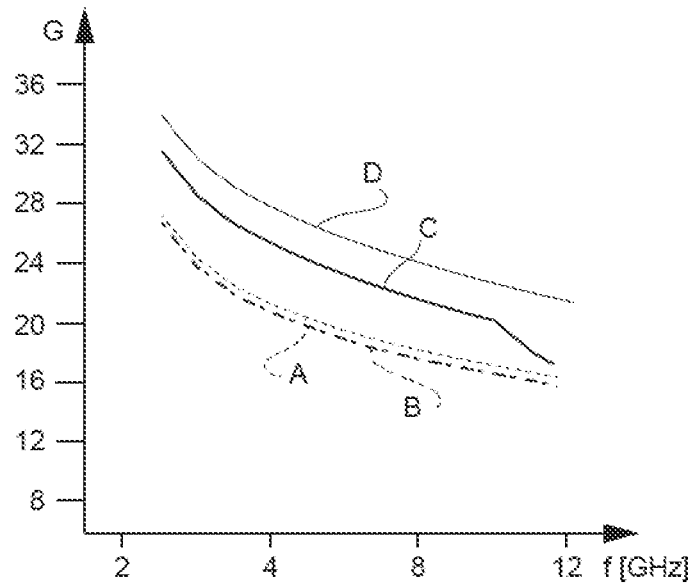
FIG. 8 shows the result of simulations carried out by the Applicant on the structures of FIGS. 1, 2, 3 and 4.

In particular, FIG. 8 shows the result of simulations carried out by the Applicant relative to the plot of the gain G obtainable with the HEMT transistor as a function of the frequency f in the range 2-10 GHz, for the HEMT transistor 1 of FIG. 1 (curve A), the HEMT transistor 30 of FIG. 2 (curve B), the HEMT transistor 50 of FIG. 3 (curve C) and the HEMT transistor 100 of FIG. 4 (curve D), respectively. As visible, the HEMT transistors 50 and 100 have a considerably greater gain with respect to the similar structures lacking the first field plate region 84, 84'.

In a not shown manner, the HEMT device shown in FIGS. 3-5 allows a not negligible improvement to be obtained also as regards electric field uniformity and thus its robustness at high voltages.

Finally, it is clear that modifications and variations may be made to the HEMT transistor and the manufacturing process thereof described and illustrated herein without thereby departing from the scope of the present disclosure. For example, the different embodiments described may be combined so as to provide further solutions.

For example, the second field plate 85 and the first field plate 84, 84', 84" may be connected in various ways to the source metallization 70; the first field plate 84" and the gate region 60" in FIG. 5 may be positioned in different ways with respect to the insulating layer 58"; and the gate region 60" in FIG. 5 may be defined in different ways, as discussed in detail hereinafter.

Connection of the Second Field Plate 85:

The second field plate 85 may be connected to the source metallization 70 through connecting regions extending either over an active area (where the 2-dimensional electron gas—2 deg— forms a channel region of the HEMT transistor and conducts current) or an inactive area surrounding the active area, as explained below.

Figure 9:
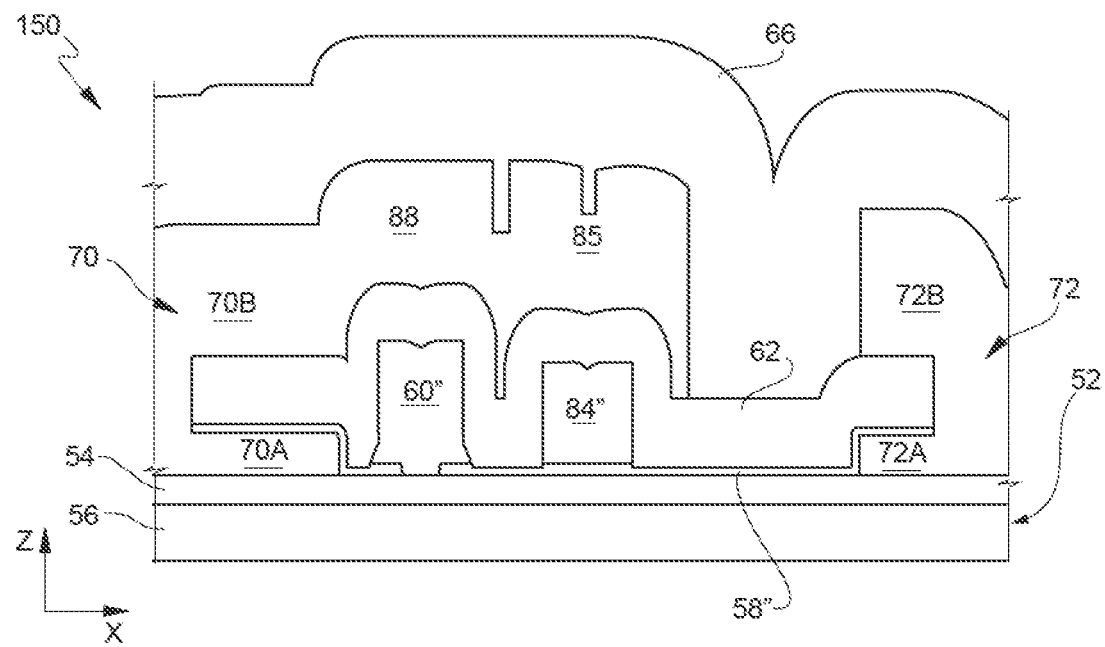
FIG. 9 is cross-section of another embodiment of the present HEMT transistor.

For example, FIG. 9 shows an embodiment where the HEMT transistor 150 of FIG. 5 has the second field plate 85 connected to the source metallization 70 through a connecting portion formed in the third metal layer which also forms the upper portion 70B of the source metallization 70, the upper portion 72B of the drain metallization 72 and the second field plate region 85, and thus defined in the same etching step.

In particular, in FIG. 9, a biasing metal portion 88 of the third metal layer extends on the second insulating layer 62 between the upper portion 70B of the source metallization 70 and the second field plate region 85 and forms a single region with them.

According to a different embodiment, the second field plate 85 is connected to the source metallization 70 through a connecting region extending over the inactive area of the HEMT transistor 150, as described hereinbelow with reference to FIG. 10, which shows the structure of an elementary cell of the HEMT transistor 150 of FIG. 5 in a plan view.

Figure 10:
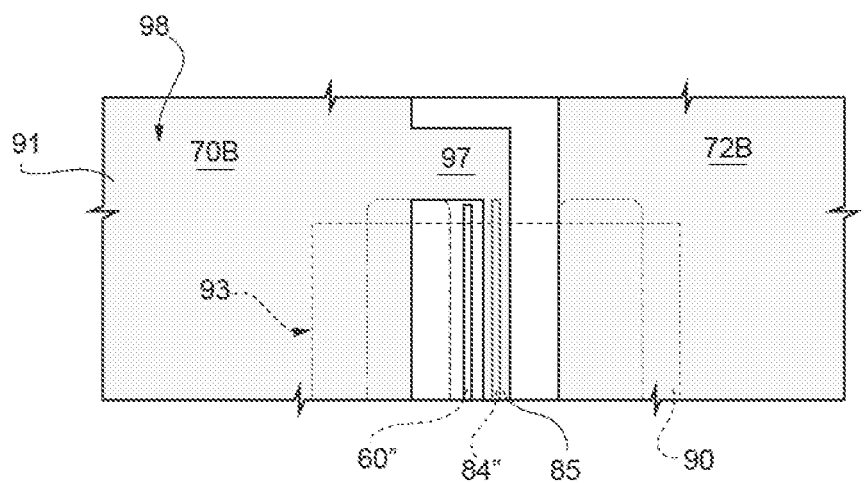
FIGS. 10 and 11 are top plan views of different embodiments of the present HEMT transistor.

It is intended that the HEMT transistor 150 may comprise a plurality of elementary cells, each having at least one source metallization 70, at least one drain metallization 72, at least one first field plate 84, and at least one second field plate 85, extending as fingers along a direction (vertical direction of FIG. 10).

FIG. 10 shows a portion of an intermediate structure of the HEMT transistor 150 after depositing and defining the second insulating layer 62 (not visible in FIG. 10) and depositing and defining a third metal layer, indicated by 98, to form the upper portions 70B and 72B of the source and drain metallizations 70, 72 and the second field plate region 85. In particular, FIG. 10 shows the active area 90 (which accommodates high mobility conduction electrons of the 2-deg), surrounded by the inactive area 91, not participating to the conduction action. The inactive area 91 is generally doped, to avoid passage of current when the HEMT transistor 150 is switched off.

In FIG. 10, line 93 indicates the boundary of the active area 90.

Here, the third metal layer 98 is also defined to form a second field plate connecting region 97 extending over the inactive area 91 between the upper portion 70B of the source metallization 70 and the second field plate region 85, thereby connecting them electrically.

Figure 11:
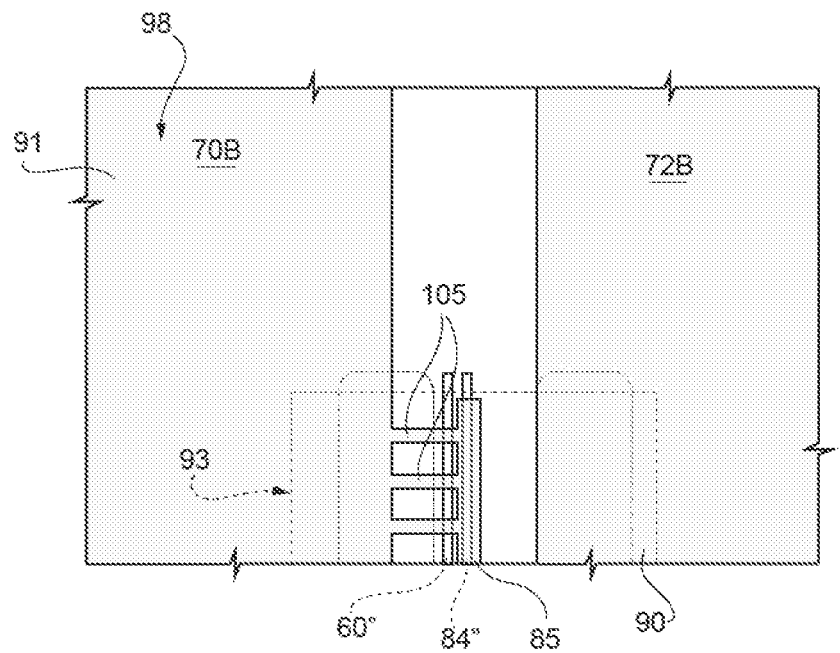

According to a different embodiment, FIG. 11, the second field plate 85 is connected to the source metallization 70 through a plurality of clips or bridge portions 105 extending at a distance to each other over the active area 90 and formed by the second metal layer 200". In this case, in a cross-section, the clips 105 are not visible (as in FIG. 5) or have a shape similar to the biasing metal portion 88 of FIG. 9, depending on whether the cross section through the HEMT transistor 150 is drawn in an area between two adjacent clips 105 or crosses one of the clips 105.

According to still another embodiment, the second field plate 85 is connected to the source metallization 70 by both the second field plate connecting region of FIG. 10 and the clips 105 of FIG. 11.

Connection of the First Field Plate 84, 84', 84":

The first field plate 84, 84', 84" may be connected to the source metallization 70 through connecting regions extending over the inactive area 91 or through the second field plate 85, as explained below.

Figure 12A:
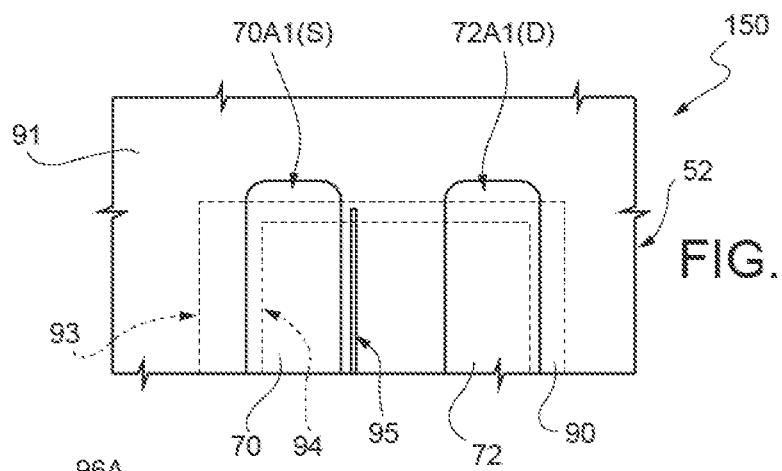
FIG. 12A-12C are top plan views of part of the HEMT transistor of FIG. 5, in subsequent manufacturing steps, according to an embodiment.
Figure 12B:
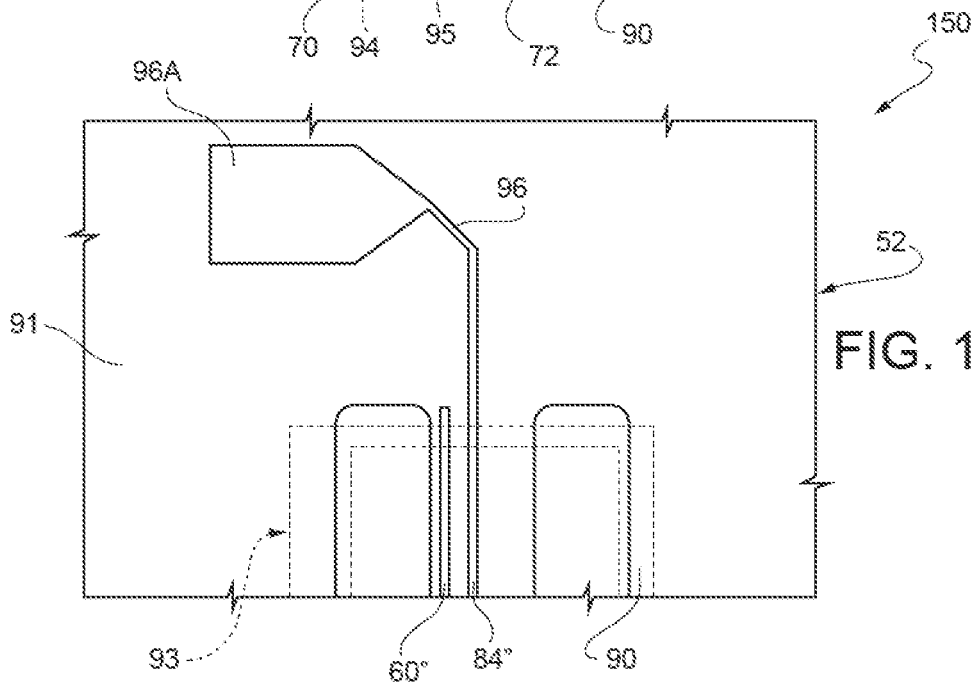
Figure 12C:
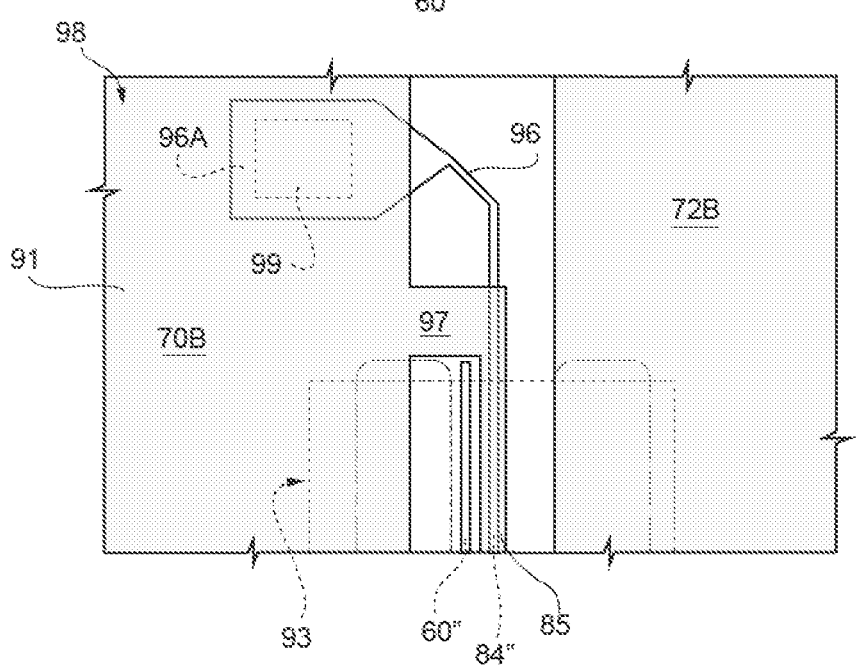

For example, the first field plate 84, 84', 84" may be connected to the source metallization 70 as shown in FIGS. 12A-12C, which show the structure of an elementary cell of the HEMT transistor 150 of FIG. 5 in three intermediate manufacturing steps (connection over the inactive area 91).

Also here, the HEMT transistor 150 may comprise a plurality of elementary cells, each having at least one source metallization 70, at least one drain metallization 72, at least one first field plate 84, and at least one second field plate 85, extending as fingers along a direction (vertical direction of FIGS. 12A-12C).

FIG. 12A shows a portion of the intermediate structure of the HEMT transistor 150 after forming the lower portions 70A, 72A of the source and drain metallizations 70, 72, and after forming and defining the insulating layer 58" (FIG. 5).

In FIG. 12A, the lower portions 70A, 72A of the source 70 and drain metallizations 72 extend mainly on the active area 90 and have ends portions 70A1, 72A1 extending on the inactive area 91. Line 93 indicates the boundary of the active area 90; line 94 indicates the boundary of insulating layer 58" (not visible) and line 95 indicates the first opening (61" in FIG. 5).

FIG. 12B shows the same portion of the intermediate structure of the HEMT transistor 150 after depositing and defining a metal layer (similar to gate metal layer 200' of FIG. 7C), so as to form the gate region 60", the first field plate 84" and a first connecting region 96. The first connecting region 96 is integral with and in prosecution of the first field plate 84", extends from and end of the first field plate 84" onto the inactive area 91 and ends with an enlarged portion 96A.

FIG. 12C shows the same portion of FIGS. 12A and 12B after depositing and defining the second insulating layer 62 (not visible in FIG. 12C) and depositing and defining the third metal layer, indicated again by 98, to form the upper portions 70B and 72B of the source and drain metallizations 70, 72 and the second field plate region 85.

In FIG. 12C, the second insulating layer 62 (FIG. 5) has been defined to form a through opening 99 over the enlarged portion 96A of the first connecting region 96.

Here, the third metal layer 98 also extends over the inactive region 91 and in particular over the enlarged portion 96A and fills the through opening 99 to form a connection via (indicated by the same number 99 since it has the same shape as the through opening). The connection via 99 electrically connects the upper portion 70B of the source metallization 70 to the enlarged portion 96A of the first connecting region 96 (at a lower level) and thus to the first field plate 84".

Here, in addition, the third metal layer 98 is also defined to form the second field plate connecting region 97 extending over the inactive area 91 between the upper portion 70B of the source metallization 70 and the second field plate region 85.

Therefore, the first connecting region 96, the connection via 99 and the second connecting region 97 form line 75 of FIG. 3, directly connecting the source metallization 70, the first field plate 84" and the second field plate region 85.

Figure 13:
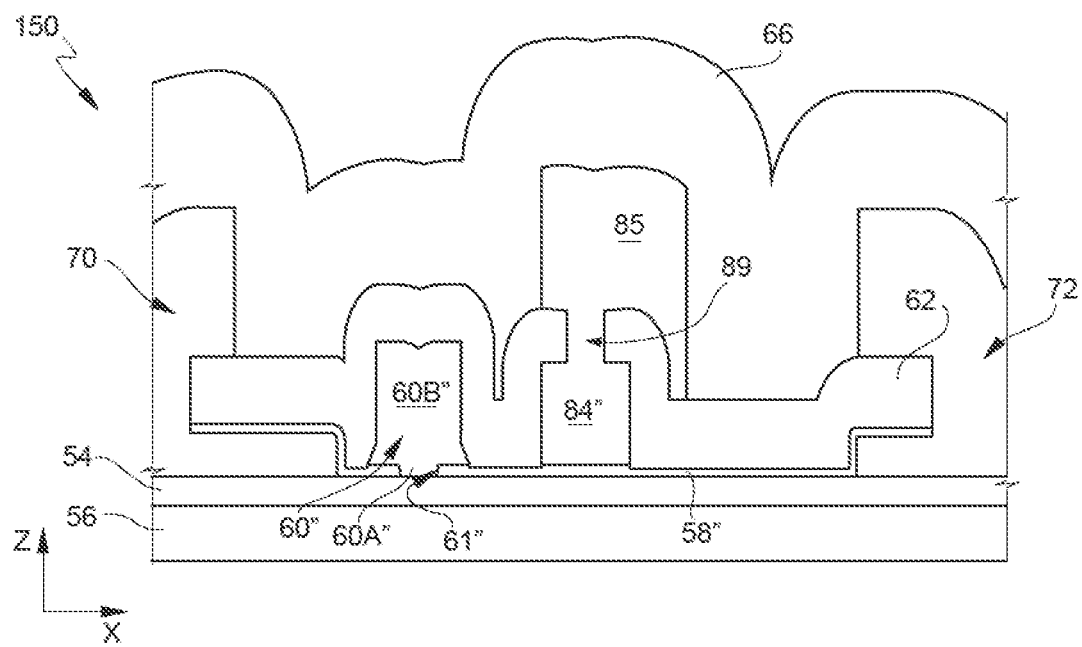
FIGS. 13-17 are cross-sections of other embodiments of the present HEMT transistor.

According to a different embodiment, the first field plate 84, 84', 84" may be connected to the source metallization 70 through the second field plate 85, as shown in FIG. 13.

In detail, in FIG. 13, the second insulating layer 62 has a through opening, called field plate connection opening 89, extending over the first field plate 84". Thereby, during deposition of the third metal layer 98, the metal enters and fills the field plate connection opening 89, forming a field plate via also indicated by 89 (since it has the same shape and is defined by the field plate connection opening 89). The field plate connection via 89 electrically connects the first field plate 84" to the second field plate region 85 and thus, through one of the solutions discussed above in section Connection of the second field plate 85, to the source metallization 70.

According to another embodiment, the first field plate 84, 84', 84" may be connected to the source metallization 70 both over the inactive area 91 (through the first connecting region 96, the enlarged portion 96A, and the connection via 99, FIGS. 12A-12C) and over the active area 90 (through the field plate connection via 89, FIG. 13), combining the solutions of FIGS. 12A-12C and FIG. 13.

Arrangement of the First Field Plate 84":

The first field plate 84" may be arranged in different ways with respect to the insulating layer 58".

Figure 14:
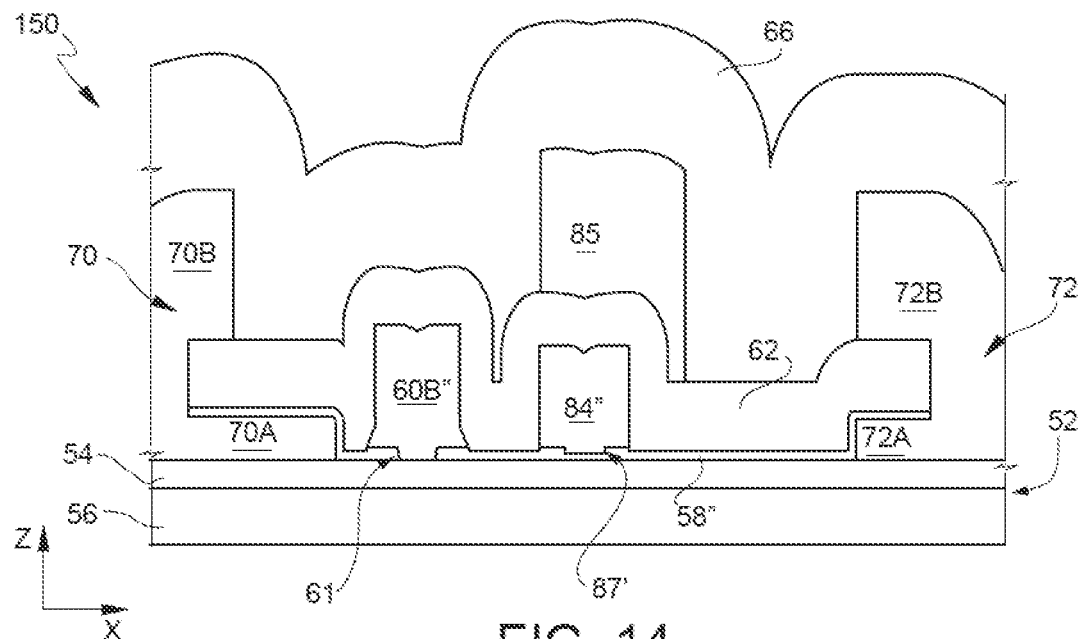

In particular, as an alternative to the arrangement shown in FIG. 5, where the first field plate 84" is formed completely over the insulating layer 58", the first field plate 84" may be formed with its lower portion inside the insulating layer 58", as shown in FIG. 14.

In this case, process steps similar to those described with reference to FIGS. 7B-7D are performed. In particular, after depositing the insulating layer 58", the first opening 61 and, in a separate etching step, a cavity 87' (corresponding to the third opening 86 and the cavity 87 of FIG. 4) are formed. Then, the gate metal layer (analogous to gate metal layer 200" of FIG. 7C) is deposited and defined to form the gate region 60" and the first field plate region 84". Thereafter, the second insulating layer 62 and the third metal layer are deposited and defined and covered by the passivation layer 66.

According to a different embodiment, the first field plate 84" may be formed to contact the semiconductor body 52. In this case, the insulating layer 58" may be removed only partially, as shown in FIG. 15.

Figure 15:
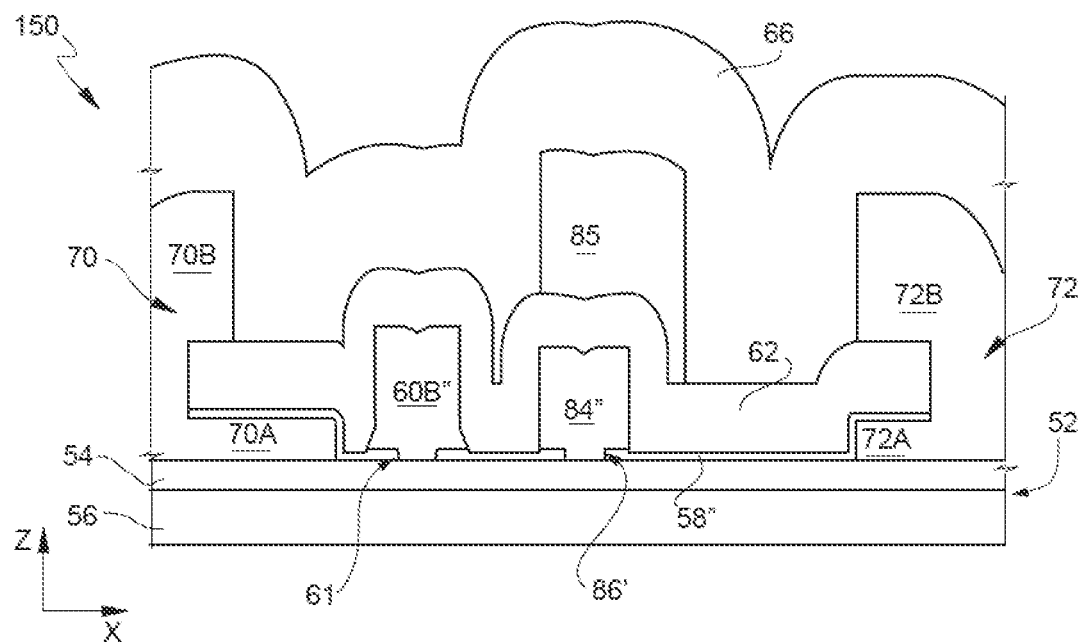

In detail, in FIG. 15, the third opening in the insulating layer 58" (here, indicated by 86') is a through opening, so that the bottom portion of the first field region 4" directly contacts the semiconductor body 52.

Figure 16:
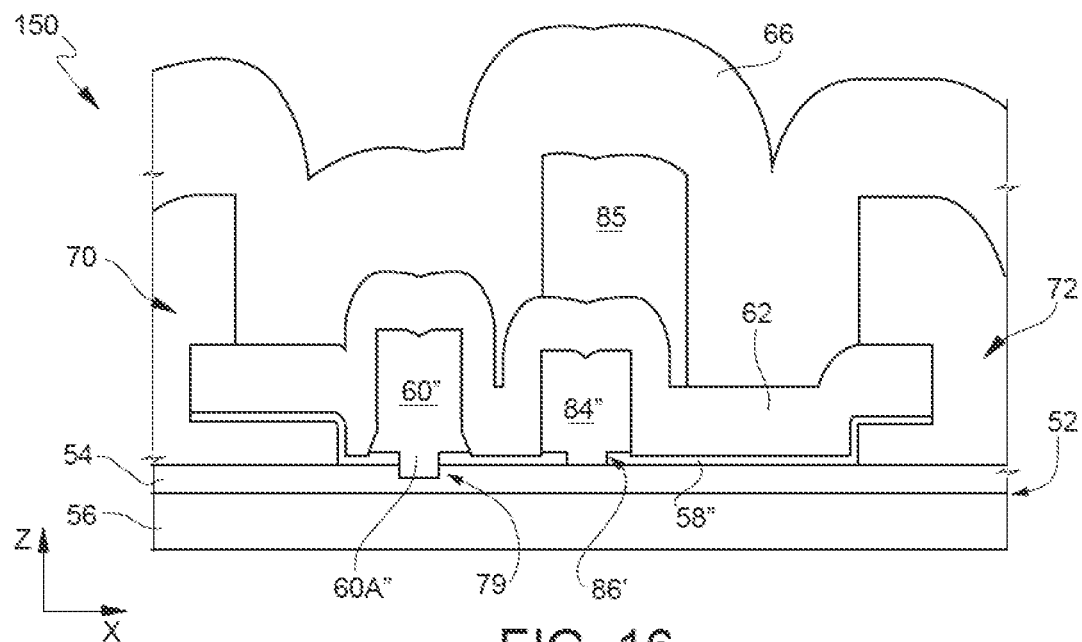

Arrangement of the Gate Region 60":

The gate region 60" may extend directly on and physical in contact with the semiconductor body 52, as shown in FIGS. 9, 12, 13-15 or may enter a recess in the semiconductor body 52, as shown in FIG. 16.

In FIG. 16, a lower gate portion 60A" of the gate 60" extends through part of the upper layer 56 of the semiconductor body 52 in a recess 79.

This solution may be used when the first field plate 84" is in direct contact with the semiconductor body 52.

Figure 17:
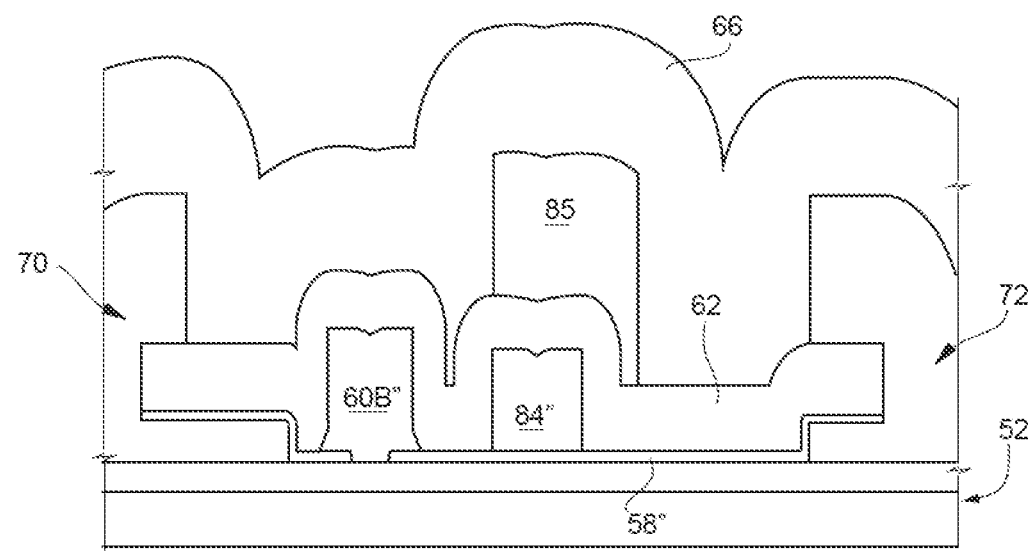

Definition of Gate Region 60" and First Field Plate 84":

The gate region 60" and the first field plate 84" may be defined through known masking and etching steps, in which case the insulating layer 58" is slightly recessed as a consequence of the etching process, as shown in FIGS. 9, 13-17 or using a lift-off process. In this case, as shown in FIG. 17, the insulating layer 58" has a planar upper surface, not recessed.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A HEMT transistor comprising:
    a semiconductor body having a semiconductive heterostructure;
    a gate region, of conductive material, arranged on and in contact with the semiconductor body;
    a first insulating layer extending over the semiconductor body, laterally to the gate region;
    a second insulating layer extending over the first insulating layer and the gate region;
    a first field plate region, of conductive material, extending between the first and the second insulating layers, laterally spaced from the gate region along a first direction, wherein the second insulating layer is in contact with a top surface of the gate region and a top surface of the first field plate region; and
    a second field plate region, of conductive material, extending over the second insulating layer, the second field plate region overlying the first field plate region, wherein the gate region includes a lower gate portion and an upper gate portion, the lower gate portion extending into a first opening of the first insulating layer and in contact with the semiconductor body; and
    a dielectric layer extending between the first and the second insulating layers, wherein the dielectric layer has a second opening and a third opening, the gate region having an intermediate gate portion extending into the second opening, between the upper gate portion and the lower gate portion, and wherein the first field plate region has a lower plate portion extending through the third opening of the dielectric layer and in a cavity of the first insulating layer, a reduced thickness portion of the first insulating layer extending between the lower plate portion and the semiconductor body.

2. The HEMT transistor according to claim 1, wherein the first and the second field plate regions are metal regions.

3. The HEMT transistor according to claim 1, wherein the upper gate portion is formed of a same material as the first field plate region.

4. The HEMT transistor according to claim 3, wherein the upper gate portion and the first field plate region are formed of aluminum.

5. The HEMT transistor according to claim 1, further comprising a drain contact region and a source contact region, of electrically conductive material, extending over and in electrical contact with the semiconductor body, through the first and the second insulating layers on opposite sides of the gate region, wherein the first field plate region is disposed between the gate region and the drain contact region.

6. The HEMT transistor according to claim 5, wherein the first field plate region is electrically coupled to the source contact region.

7. The HEMT transistor according to claim 1, wherein the first field plate region has a first width along the first direction, and the second field plate region has a second width along the first direction, wherein the second width is greater than the first width.

8. The HEMT transistor according to claim 1, wherein the semiconductor body comprises at least a first semiconductor layer including aluminum gallium nitride, and a second semiconductor layer including gallium nitride, wherein the second semiconductor layer is contiguous to the first insulating layer.

9. The HEMT transistor according to claim 1, further comprising a drain contact region and a source contact region, of electrically conductive material, extending over and in electrical contact with the semiconductor body, through the first and the second insulating layers on opposite sides of the gate region,
the semiconductor body comprising an active area and an inactive area, the gate region, the first field plate region and the second field plate region extending over the active area,
wherein the first field plate region is in electrical contact with the source contact region through a field plate contact region extending from the first field plate region on the inactive area and a connection via extending between the field plate contact region and an upper portion of the source contact region.

10. The HEMT transistor according to claim 1, further comprising a drain contact region and a source contact region, of electrically conductive material, extending over and in electrical contact with the semiconductor body, through the first and the second insulating layers on opposite sides of the gate region,
the semiconductor body comprising an active area and an inactive area, the gate region, the first field plate region and the second field plate region extending over the active area,
wherein the first field plate region is in electrical contact with the second field plate region through a field plate connection via extending through the second insulating layer over the active area.

11. The HEMT transistor according to claim 1, further comprising a drain contact region and a source contact region, of electrically conductive material, extending over and in electrical contact with the semiconductor body, through the first and the second insulating layers on opposite sides of the gate region,
the semiconductor body comprising an active area and an inactive area, the gate region, the first field plate region and the second field plate region extending over the active area,
a metal portion extending on the second insulating layer between the source contact region and the second field plate region.

12. A device, comprising:
a semiconductor body having a semiconductive heterostructure;
a conductive gate region on the semiconductor body;
a first insulating layer on the semiconductor body, at least a portion of the conductive gate region extending through a first opening in the first insulating layer;
a second insulating layer on the first insulating layer and the conductive gate region;
a first conductive field plate extending between and in contact with the first and the second insulating layers, the first conductive field plate spaced laterally apart from the conductive gate region along a first direction;
a second conductive field plate on the second insulating layer, the second conductive field plate overlying the first conductive field plate along a second direction transverse to the first direction, the second insulating layer extending directly between the first conductive field plate and the second conductive field plate along the second direction, wherein the second insulating layer is in contact with a top surface of the conductive gate region and a top surface of the first conductive field plate; and
a dielectric layer extending between the first and the second insulating layers, wherein the dielectric layer has a second opening, wherein the conductive gate region includes a lower gate portion in the opening and in contact with the semiconductor body, a first intermediate gate portion between the first insulating layer and the dielectric layer, a second intermediate gate portion in the second opening above the first intermediate gate portion, and an upper gate portion above the second opening, wherein the first intermediate gate portion is wider in the first direction than the second intermediate gate portion.

13. The device according to claim 12, wherein at least a portion of the conductive gate region is formed of a same material as the first conductive field plate.

14. The device according to claim 13, wherein the at least a portion of the conductive gate region and the first conductive field plate are formed of aluminum.

15. The device according to claim 12, further comprising:
a drain contact on and in contact with the semiconductor body; and
a source contact on and in contact with the semiconductor body,
wherein each of the drain contact and the source contact extends through the first insulating layer and through the second insulating layer on opposite sides of the conductive gate region, wherein the first conductive field plate is disposed between the conductive gate region and the drain contact along the first direction.

16. The device according to claim 15, wherein the first conductive field plate is electrically coupled to the source contact.

17. A device, comprising:
a semiconductor body including a semiconductor heterostructure;
a first insulating layer on the semiconductor body and having a first opening and a recess spaced laterally apart from the first opening;
a gate region, of conductive material, on the first insulating layer and in contact with the semiconductor body through the first opening;
a first field plate region, of conductive material, on the first insulating layer, the first field plate region spaced laterally apart from the gate region and positioned in the recess;
a second insulating layer over the gate region, the first field plate region, and the first insulating layer; and
a second field plate region over the second insulating layer and the first field plate region, wherein the second insulating layer is in contact with a top surface of the gate region and a top surface of the first field plate region, wherein the gate region includes a lower gate portion and an upper gate portion, the lower gate portion extending into the first opening of the first insulating layer and in contact with the semiconductor body; and
a dielectric layer extending between the first and the second insulating layers, wherein the dielectric layer has a second opening and a third opening, the gate region having an intermediate gate portion extending into the second opening, between the upper gate portion and the lower gate portion, and wherein the first field plate region has a lower plate portion extending through the third opening of the dielectric layer and in the recess of the first insulating layer, a reduced thickness portion of the first insulating layer extending between the lower plate portion and the semiconductor body.

18. The device according to claim 17, wherein the gate region and the first field plate region are a same material.

19. The device according to claim 18, wherein the material is aluminum.

* * * * *